(12) United States Patent
Morvan et al.

(10) Patent No.: US 8,853,023 B2
(45) Date of Patent: Oct. 7, 2014

(54) METHOD FOR STRESSING A THIN PATTERN AND TRANSISTOR FABRICATION METHOD INCORPORATING SAID METHOD

(71) Applicant: Commissariat a l'Energie Atomique et aux Energies Alternatives, Paris (FR)

(72) Inventors: Simeon Morvan, Grenoble (FR); Francois Andrieu, Grenoble (FR); Jean-Charles Barbe, Izeron (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 51 days.

(21) Appl. No.: 13/753,436

(22) Filed: Jan. 29, 2013

(65) Prior Publication Data
US 2013/0196456 A1 Aug. 1, 2013

(30) Foreign Application Priority Data
Jan. 30, 2012 (FR) ...................... 12 50841

(51) Int. Cl.
| | | |
|---|---|---|
| H01L 21/00 | (2006.01) | |
| H01L 21/02 | (2006.01) | |
| H01L 21/762 | (2006.01) | |
| H01L 21/66 | (2006.01) | |
| H01L 29/78 | (2006.01) | |
| H01L 29/786 | (2006.01) | |
| H01L 29/66 | (2006.01) | |

(52) U.S. Cl.
CPC .... *H01L 21/02107* (2013.01); *H01L 21/76232* (2013.01); *H01L 22/12* (2013.01); *H01L 29/7849* (2013.01); *H01L 29/78684* (2013.01); *H01L 29/66772* (2013.01)
USPC .................... 438/198; 438/197; 257/E29.193

(58) Field of Classification Search
None
See application file for complete search history.

(56) References Cited

U.S. PATENT DOCUMENTS

| | | | | |
|---|---|---|---|---|
| 6,369,438 B1 * | 4/2002 | Sugiyama et al. | ............ | 257/616 |
| 6,867,433 B2 * | 3/2005 | Yeo et al. | ......... | 257/67 |

(Continued)

FOREIGN PATENT DOCUMENTS

FR    2872626 A1    1/2006

OTHER PUBLICATIONS

"A Novel Fabrication Technique of Ultrathin and Relaxed SiGe Buffer Layers with High Ge Fraction for Sub-100 nm Strained Silicon-on-Insulator MOSFETs" Tsutomu Tezuka, Naoharu Sugiyama, Tomohisa Mizuno, Masamichi Suzuki and Shin-ichi Takagi; 2001 Jpn. J. Appl. Phys. 40 2866.*

(Continued)

*Primary Examiner* — Scott B Geyer
*Assistant Examiner* — Evren Seven
(74) *Attorney, Agent, or Firm* — Baker and Hostetler LLP

(57) ABSTRACT

A method for stressing a pattern having a pattern surface, in a layer of semiconductive material that can be silicon on the surface of a stack of layers generated on the surface of a substrate, said stack comprising at least one stress layer of alloy $Si_xGe_y$ with x and y being molar fractions, and a buried layer of silicon oxide, comprises: etching at the periphery of a surface of dimensions greater than said pattern surface, of the buried layer of silicon oxide and layer of alloy $Si_xGe_y$ over a part of the depth of said layer of alloy; the buried layer of silicon oxide being situated between said layer of semiconductive material and said stress layer of alloy $Si_xGe_y$. In a transistor structure, etching at the periphery of said surface obtains a pattern thus defined having dimensions greater than the area of interest situated under the gate of the transistor.

13 Claims, 9 Drawing Sheets

(56) References Cited

U.S. PATENT DOCUMENTS

| | | | |
|---|---|---|---|
| 7,084,051 B2* | 8/2006 | Ueda | 438/518 |
| 7,485,518 B2* | 2/2009 | Chan et al. | 438/197 |
| 7,608,489 B2* | 10/2009 | Chidambarrao et al. | 438/142 |
| 7,700,416 B1* | 4/2010 | Clifton et al. | 438/142 |
| 7,851,325 B1 | 12/2010 | Gaines et al. | |
| 7,968,912 B2* | 6/2011 | Kim et al. | 257/192 |
| 8,003,486 B2* | 8/2011 | Gaines et al. | 438/424 |
| 8,124,470 B1 | 2/2012 | Bedell et al. | |
| 8,343,780 B2 | 1/2013 | Barbe et al. | |
| 8,519,486 B2* | 8/2013 | Tamura | 257/408 |
| 8,530,934 B2* | 9/2013 | Enicks et al. | 257/190 |
| 2004/0173812 A1 | 9/2004 | Currie et al. | |
| 2005/0106792 A1 | 5/2005 | Cea et al. | |
| 2006/0006420 A1* | 1/2006 | Goto | 257/204 |
| 2006/0163557 A1 | 7/2006 | Hatada et al. | |
| 2006/0199310 A1* | 9/2006 | Nakabayashi et al. | 438/128 |
| 2006/0284252 A1* | 12/2006 | Boussagol et al. | 257/347 |
| 2007/0215859 A1 | 9/2007 | Clifton | |
| 2008/0169490 A1* | 7/2008 | Kawai | 257/288 |
| 2008/0251813 A1* | 10/2008 | Boyd et al. | 257/190 |
| 2009/0050972 A1* | 2/2009 | Lindsay et al. | 257/368 |
| 2010/0001323 A1* | 1/2010 | Tateshita | 257/288 |
| 2011/0254092 A1* | 10/2011 | Yang et al. | 257/351 |

OTHER PUBLICATIONS

James G. Fiorenza, et al., "Detailed Simulation Study of a Reverse Embedded-SiGe Strained-Silicon MOSFET", IEEE Transactions on Electron Device, Feb. 2008, pp. 640-648, vol. 55, No. 2, IEEE.

J.M. Hartmann, et al., "Critical Thickness for Plastic Relaxation of SiGe on Si(001) Revisited", Journal of Applied Physics, 2011, pp. 083529-1 thru 083529-8, vol. 110.

B. Vincent, et al., "Fabrication of SiGe-on-Insulator Substrates by a Condensation Technique: an Experimental and Modelling Study", Semiconductor Science and Technology, 2007, pp. 237-244, vol. 22, Institute of Physics Publishing, UK.

* cited by examiner

METHOD FOR STRESSING A THIN PATTERN AND TRANSISTOR FABRICATION METHOD INCORPORATING SAID METHOD

CROSS-REFERENCE TO RELATED APPLICATION

This application claims priority to foreign French patent application No. FR 1250841, filed on Jan. 30, 2012, the disclosure of which is incorporated by reference in its entirety.

FIELD OF THE INVENTION

The field of the invention is that of semiconductive materials notably used in microelectronics.

BACKGROUND

The integrated circuits are generally fabricated on silicon substrates. Substrates of "SOI" (Silicon On Insulator) type corresponding to substrates of silicon incorporating a layer of silica oxide $SIO_2$ are commonly used in the microelectronics industry and notably for the fabrication of transistors, making it possible to reduce leakage currents.

FIG. 1 illustrates a conventional transistor scheme produced from a semiconductive substrate 1, and conventionally comprising a source 2a, a drain 2b and a gate 4, said gate being separated from a conductive channel 2, by an insulating material 3 also called gate insulator, and comprising elements 5a and 5b called insulating spacers, notably described in a patent application FR 2 872 626 of the Applicant.

Conventionally, the semiconductive material is locally doped so as to define the regions corresponding to the source and to the drain. This doping operation can notably be carried out by ion implantation, the nature of the ion species implanted, of electron donor or acceptor type, defining the nature of the transistor: transistor respectively called NMOS or PMOS.

In order to increase performance in terms of mobility and bearers of a transistor, it has already been shown that it was possible to act on the stresses exerted at the level of the layer of silicon (or of any other semiconductive material) of the SOI substrate, to increase the mobility of the bearers by virtue of the effect of a mechanical stress on a semiconductive material generating a very strong enhancement in the mobility of the bearers and therefore the electrical performance levels of the transistors.

The applicant has notably filed the patent application FR 2 872 626 relating to a method making it possible to stress or deform a pattern or a thin layer from an initial component comprising a prestress layer. This method comprises a step of etching the prestress layer at right angles to its surface. This prestress layer can be insulating or conductive but, for applications such as the control of the transport properties by deformation of the channel of an MOS transistor, it is preferably electrically insulating (for example made of $Si_3N_4$), in order to limit the leakage currents.

Other authors: J. G. Fiorenza "Detailed Simulation Study of a Reverse Embedded-SiGe Strained-Silicon MOSFET" IEEE Transactions on Electron Devices; Vol. 55, No. 2, p. 640; 2008, have proposed, on a similar principle, to transfer stress into the channel: a layer of SiGe with a germanium concentration of 35%, in compression induces a tension in the channel just above, simulations making it possible to optimize the process with certain physical and architectural parameters of the structure, as illustrated in FIG. 2.

The simulations of this publication show an optimization according to two criteria:
the maximization of the ratio of the thickness of the layer of $Si_xGe_y$ (tSiGe) to the thickness of the higher layer of Si (tSi);
the aspect ratio AR=(tSiGe+tSi)/W with W being the length of the pattern produced, such that 0.3<AR<0.5.

According to this structure, there is an advantage only from a stress point of view: the absence of buried oxide layer between the silicon and the prestress layer facilitates the transfer of stress.

Nevertheless, drawbacks remain:
the stress layer of SiGe has the same dimension as the gate with the spacer which is less than the dimension of the active area in the case of a transistor structure, whereas the reduction of this dimension is a factor reducing the stress transmitted.
the etching of the prestress layer takes place after the gate deposition step.

Authors have also described, in the patent application US 2006/0163557, complex structures having a succession of several layers of SiGe.

SUMMARY OF THE INVENTION

In this context, the applicant proposes etching said layers in peripheral areas more remote from the channel into which the stress is to be passed and more generally in the pattern of interest. In the case of a transistor structure, the etching is thus done at the periphery of the areas intended for source and drain functions and not just in the region intended for the gate function. Moreover, the applicant has addressed structures comprising not only a stress layer of alloy of SiGe but also a layer of silicon oxide situated between said stress layer and said layer of silicon into which said stress is to be transferred, so as not to transfer problems of dislocations likely to occur from the stress layer in limit conditions to the silicon layer, as will be explained in more detail hereinafter in the description.

This is why, and more specifically, the subject of the present invention is a method for stressing a pattern having a so-called pattern surface, in a layer of semiconductive material that can be silicon on the surface of a stack of layers generated on the surface of a substrate, said stack comprising at least one stress layer of alloy $Si_xGe_y$ with x and y being molar fractions, and a buried layer of silicon oxide, characterized in that:
it comprises the etching at the periphery of a surface of dimensions greater than those of said pattern surface, of the buried layer of silicon oxide and of the stress layer of alloy $Si_xGe_y$ over at least a part of the depth of said layer of alloy;
the buried layer of silicon oxide (BOX) being situated between said layer of semiconductive material which can be silicon and said stress layer of alloy $Si_xGe_y$.

According to a variant of the invention, the molar fraction y is equal to 1−x.

According to a variant of the invention, the alloy $Si_xGe_y$ is doped.

According to a variant of the invention, the thickness of the layer of alloy $Si_xGe_y$ is substantially equal to the critical thickness beyond which dislocations are likely to appear in said layer of alloy $Si_xGe_y$.

According to a variant of the invention, the method comprises the determination:
of a first function $t_{SiGe}=f(W)$, relating to the trend of an optimum thickness of the layer of alloy $Si_xGe_y$ ($t_{SiGe}$) as a function of a pattern dimension (W), making it possible to obtain a maximum stress ($S0_{ZZ}$) in said pattern, said optimum thickness being independent of the molar fraction y of a second function $tc_{SiGe}=g(y)$ relating to the trend of the critical thickness of the layer of alloy $Si_xGe_y$ beyond which dislocations appear in said stress layer for a given molar fraction y;

the determination of a molar fraction y by equality of the thicknesses $t_{SiGe}=tc_{SiGe}$, making it possible to define, for a given pattern dimension, an optimum pair of values $(t_{SiGe}, y)$.

According to a variant of the invention, the etching is performed also in a part of said substrate over a non-zero etching depth, so as to increase the transfer of stress.

Another subject of the invention is a transistor fabrication method, characterized in that it comprises the method for stressing a pattern according to the present invention and comprising the etching of an active area of which the dimension in the direction of the current in the plane of the layers is at least greater than or equal to the sum of the dimensions of a source area, of a gate area and of a drain area.

According to a variant of the invention, the method comprises:

a step of deposition of a layer of silicon nitride, after the step of etching of the active area;

a step of thick oxide layer deposition;

the production of oxide insulation blocks on either side of the source, gate and drain areas, making it possible to define oxide blocks according to a method similar to a conventional STI method.

BRIEF LIST OF THE DRAWINGS

The invention will be better understood, and other advantages will become apparent, on reading the following description given as a nonlimiting example and by virtue of the appended figures in which.

Figure 8:
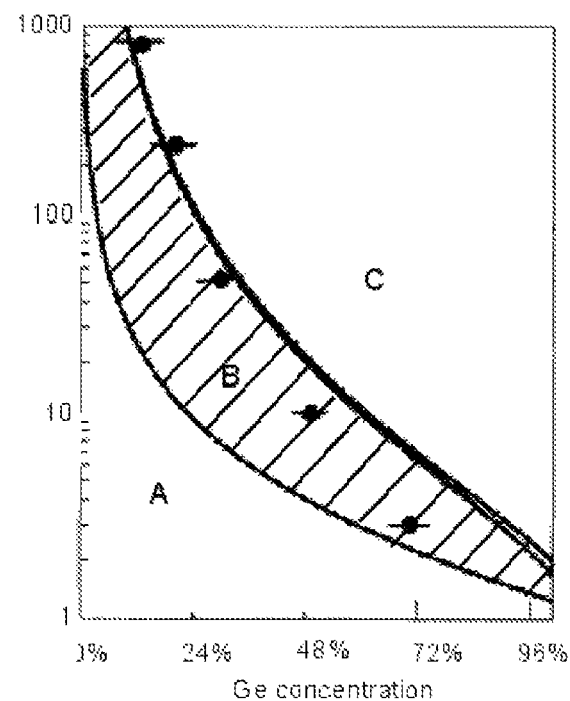
FIG. 8 illustrates the trend of the critical thickness of a layer of alloy of silicon and germanium as a function of the germanium concentration in the alloy.
Figure 9:
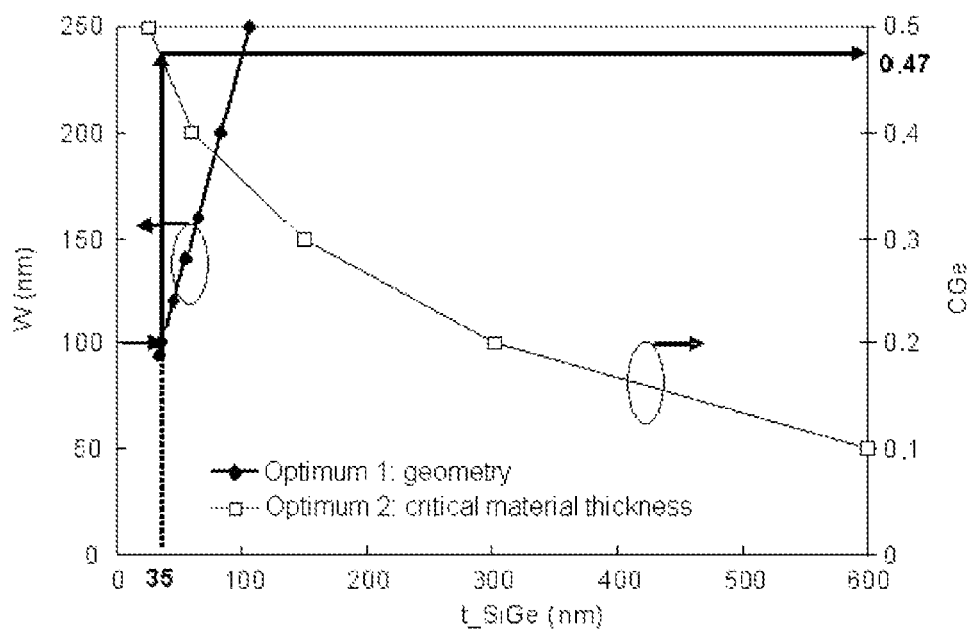
Figure 10:
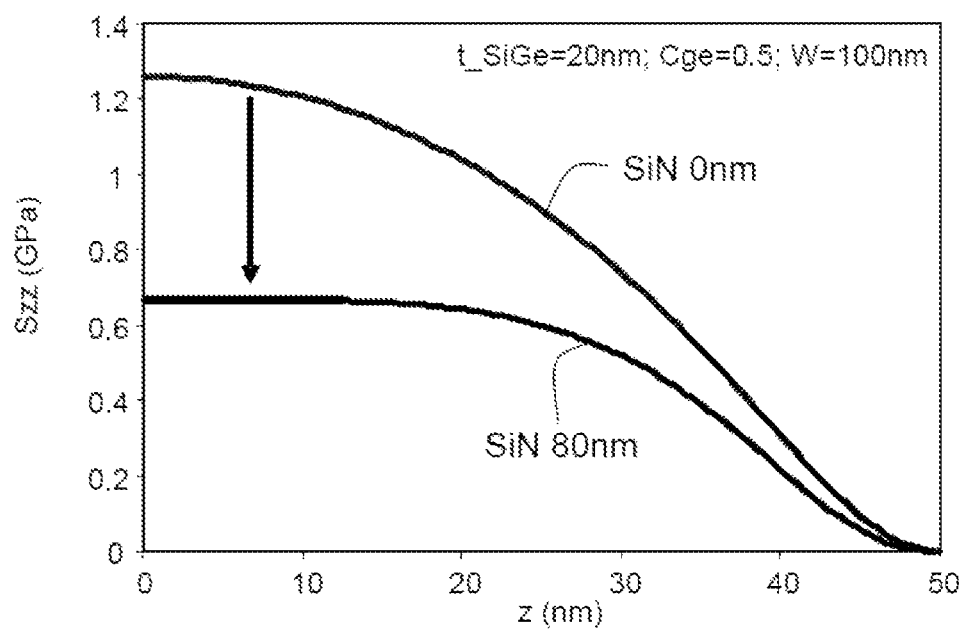
Figure 12:
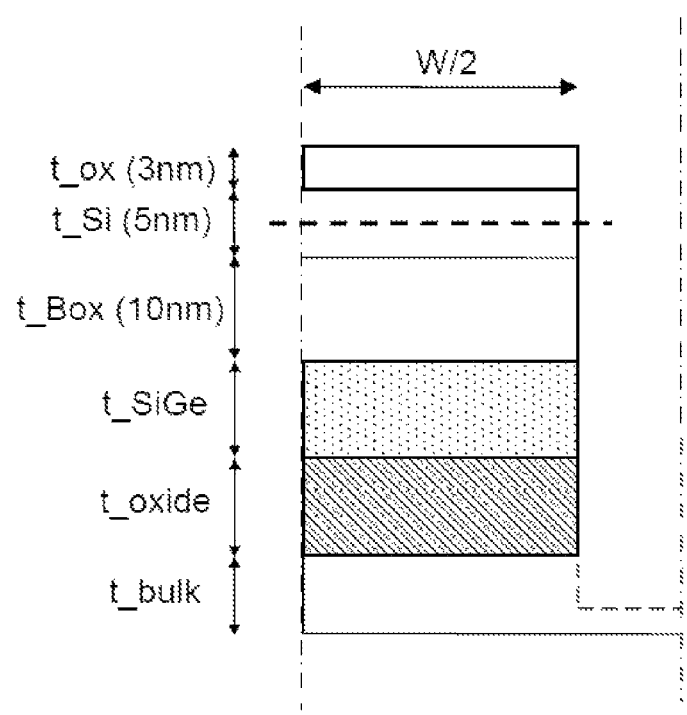

FIG. 9 schematically represents a step of the method according to the invention in which the linear relationship as illustrated in FIG. 8 is posted to determine a molar fraction of germanium in the alloy and corresponding to a critical thickness value;

FIG. 10 illustrates an exemplary stress profile with a thickness of 80 nm of SiN during an etching operation in a method of the invention;

FIGS. 11a to 11f illustrate the different steps of a method for fabricating a transistor using the method of the invention;

FIG. 12 illustrates a second stack of layers used in an exemplary method of the invention.

DETAILED DESCRIPTION

Figure 1:
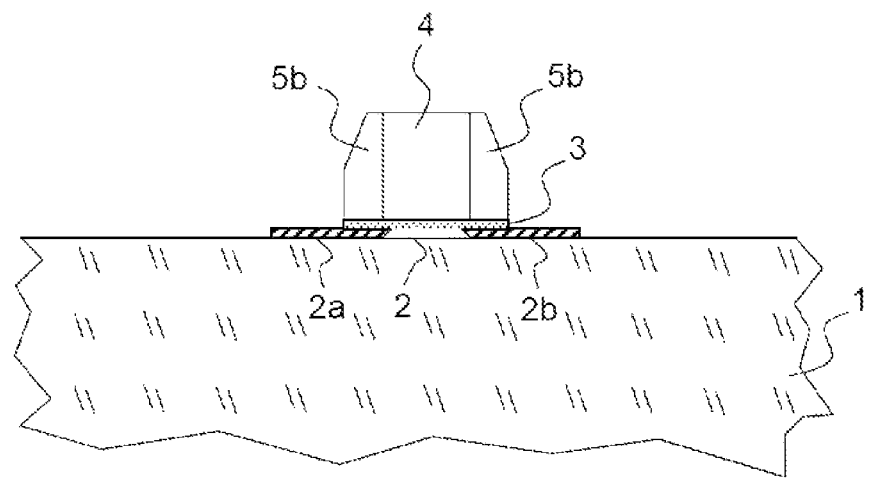
FIG. 1 illustrates a conventional transistor schema described in the patent application FR 2 872 626.
Figure 2:
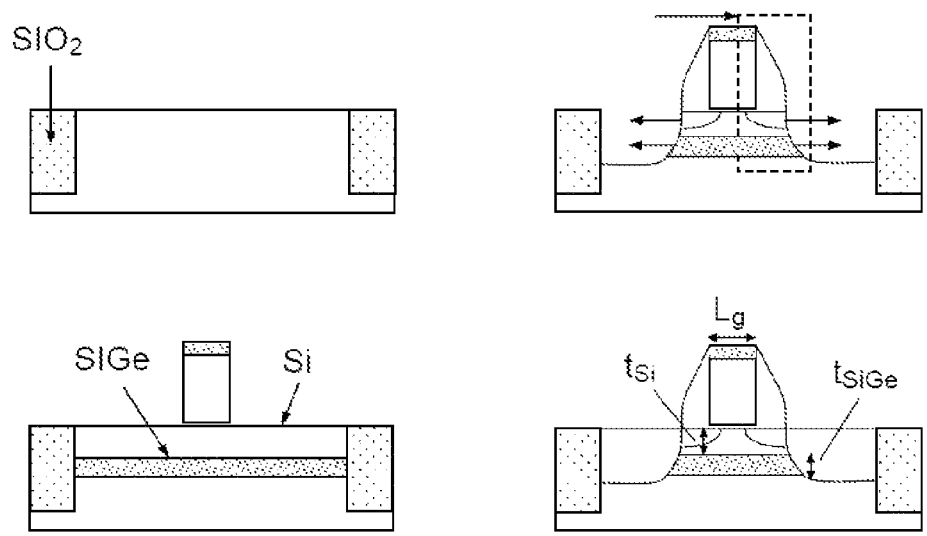
FIG. 2 illustrates a transistor structure with a stress layer of SiGe according to the prior art.
Figure 3A:
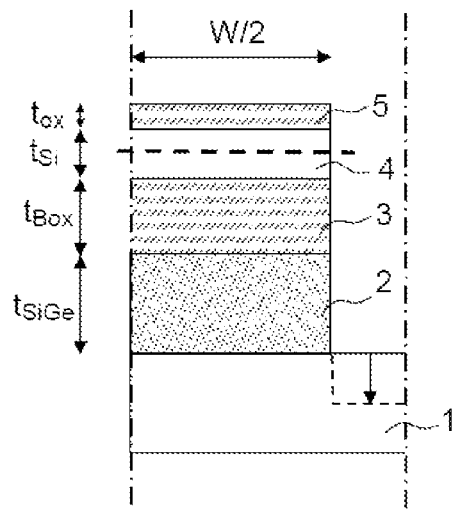
FIGS. 3a, 3b and 3c illustrate a structure that can be optimized according to the method of the present invention in the case of a transistor structure.

According to the method of the present invention, a structure is created comprising a substrate 1, a prestress layer 2 of $Si_xGe_y$, a buried layer of oxide 3 also called Box, itself in contact with the layer of silicon 4 in which a pattern comprising a stress transfer is to be produced by etching at the periphery of said structure, and a layer 5 of native oxide which would be formed, as illustrated in FIG. 3a which also highlights:

the thickness of the prestress layer of alloy of SiGe: $t_{SiGe}$;
the thickness of the layer of oxide: $t_{Box}$;
the thickness of the layer of silicon: $t_{Si}$;
the thickness of the top layer of oxide $t_{ox}$;
the depth of etching in the substrate $t_{etch}$.

The structure studied makes it possible to transfer the stress in a thin film of silicon or any other semiconductor. For this, the prestress layer of $Si_xGe_y$ in compression is slightly relaxed during the etching defining the active areas. A tension stress is then induced in the top layers and in particular in the silicon through the thin buried insulating layer (Box). The aim of this structure is to improve the mobility of the bearers by virtue of a tension stress in the transistors FDSOI for the advance nodes (sub-22 nm).

Figure 3B:
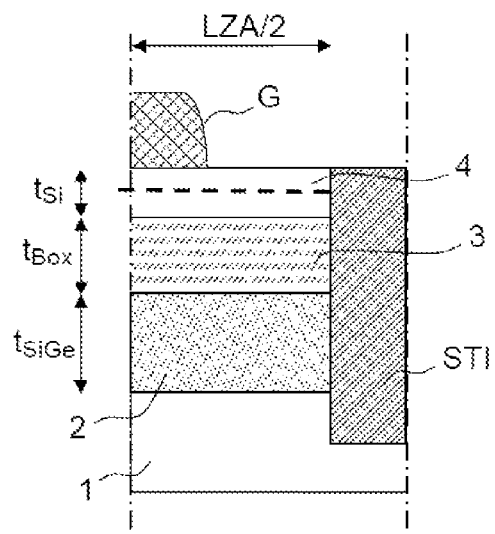

FIG. 3b illustrates a half-structure of this type of transistor, highlighting the gate and the insulating blocks STI (shallow trench isolation), according to known structures of individual transistors insulated from one another by insulating oxide blocks.

The prestress layer of $Si_xGe_y$ in compression is at least partially relaxed during the etching defining the active areas. A tension stress is then induced in the top layers and in particular in the silicon through the thin insulating layer Box.

Figure 4:
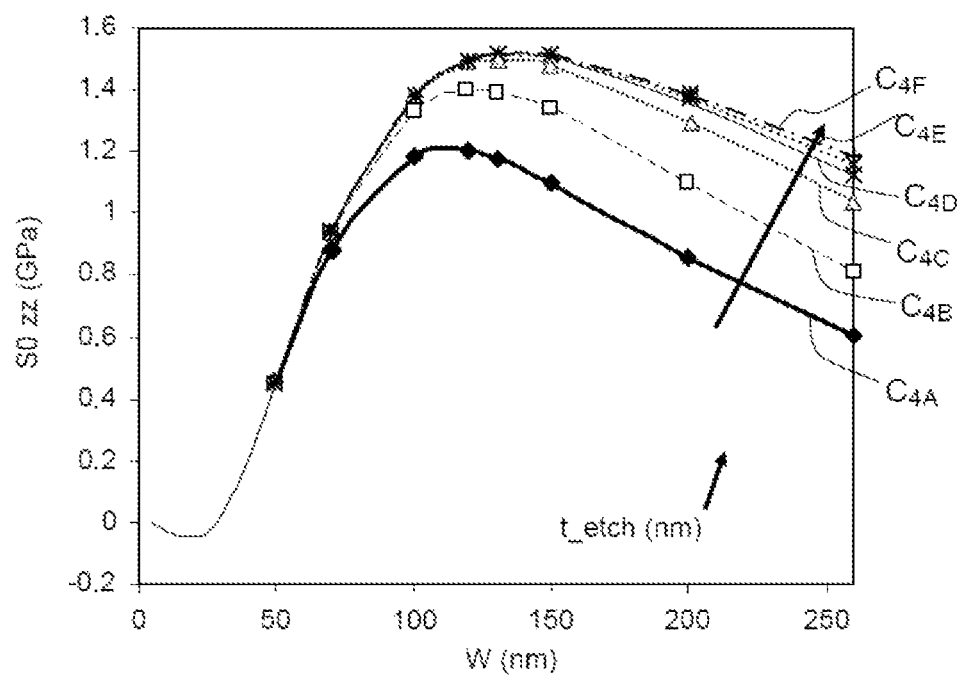
FIG. 4 illustrates the trend of the stress $S0_{ZZ}$ according to the width of the stress pattern, and for different depths of etching in the Si substrate below the prestress layer of $Si_xGe_y$.

The Applicant has shown that it was possible to reinforce the stress at the centre of the layer of Si by also partially etching the substrate over an etching depth as the results of FIG. 4 illustrate, the curves $C_{4A}$, $C_{4B}$, $C_{4C}$, $C_{4D}$, $C_{4E}$ and $C_{4F}$ relating to different increasing etching depths respectively of 0 nm, 10 nm, 30 nm, 50 nm, 70 nm and 200 nm.

Figure 5:
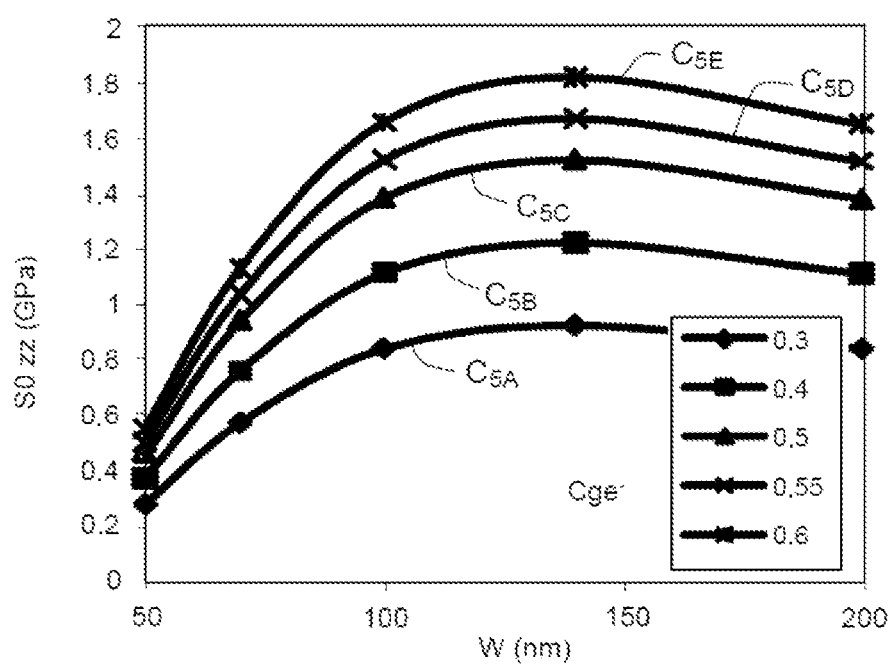
FIG. 5 illustrates the trend of the stress $S0_{ZZ}$ as a function of the width of the stress pattern, and for different germanium concentrations in a layer of alloy $Si_xGe_y$.

The Applicant has also shown that the alloy $Si_xGe_y$ has a strong intrinsic stress that can be modulated with the concentration of Ge as is illustrated by the curves of FIG. 5 relating to the trend of the stress component along the axis z, $S0_{ZZ}$ in GPa at the centre of the active area in the top layer of silicon, for a pattern length W, and for different concentrations y of germanium in the alloy $Si_xGe_y$. The curves $C_{5A}$, $C_{5B}$, $C_{5C}$, $C_{5D}$ and $C_{5E}$ respectively relate to molar fractions of 0.6, 0.55, 0.5, 0.4 and 0.3.

Figure 6:
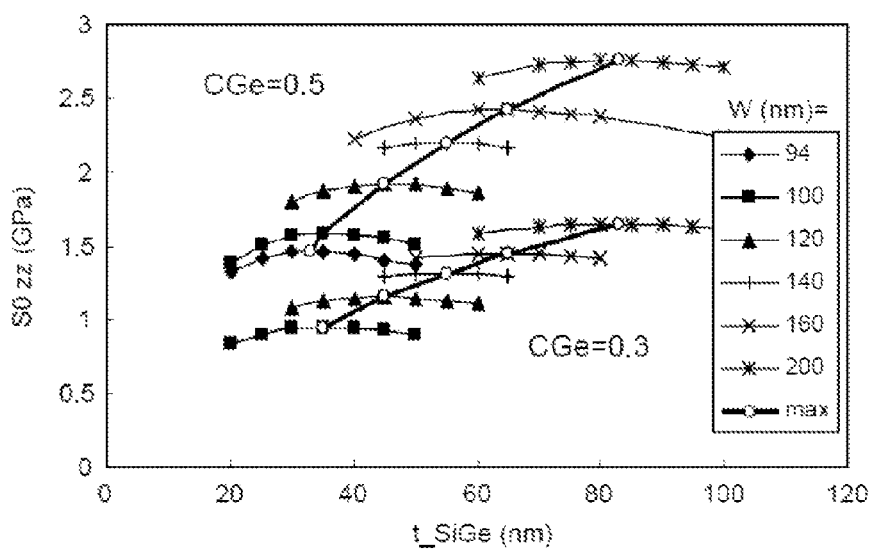
FIG. 6 illustrates, for a set of given stress pattern dimensions, the trend of the stress $S0_{ZZ}$ as a function of the thickness of the layer of alloy of silicon and germanium.

The Applicant has shown that, for each stress pattern dimension W, there is an optimum thickness of $Si_xGe_y$ that makes it possible to obtain a maximum for the stress component along the axis z, $S0_{ZZ}$ in GPa. The different curves respectively relate to patterns of dimension W equal to: 94 nm, 100 nm, 120 nm, 140 nm, 160 nm and 200 nm, and it is then possible to define curves passing through the maxima of these stresses for two examples of molar concentrations of germanium respectively of 0.3 and 0.5 as shown in FIG. 6.

Figure 7:
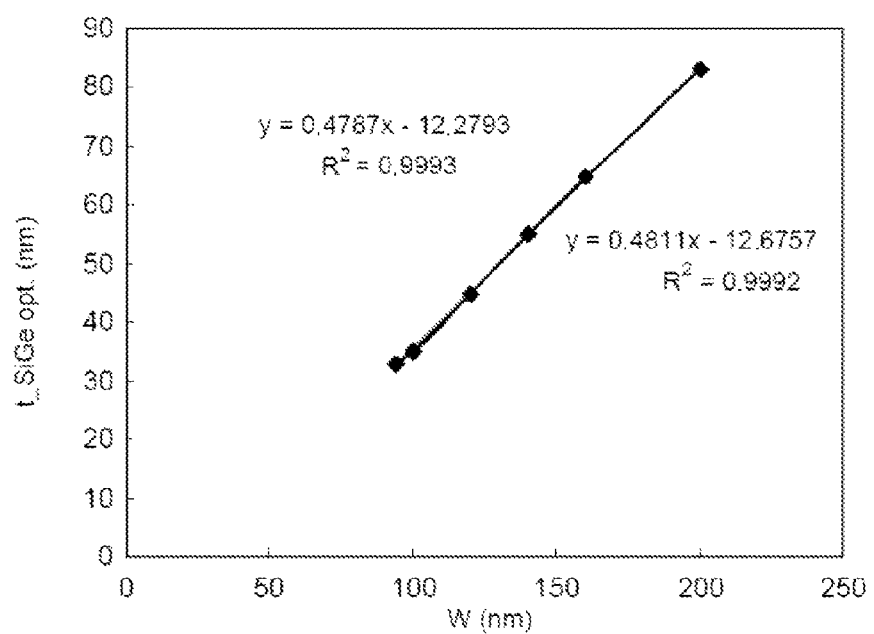
FIG. 7 illustrates the linear relationship that exists between the thickness of the layer of alloy of silicon and germanium and the dimension of the stress pattern, for a maximum stress.

The value of W corresponding to this stress optimum is independent of the concentration, showing that it is possible to establish a linear relationship between the thickness of the layer of alloy for which the stress is maximum as a function of the width of the pattern as illustrated by FIG. 7. The stress at the middle of the film of silicon increases with the concentration of germanium and with the thickness of the alloy of SiGe but the properties of this material impose a critical thickness beyond which dislocations appear and where the stress is no longer maintained. It should be noted that the prestress layer 2 being situated under the layer of oxide 3, the latter prevents any propagation of dislocation from the layer 3 to the silicon film 4.

To this end, FIG. 8 illustrates data from the literature relating to critical plastic relaxation thicknesses of alloy SiGe as a function of the germanium concentration. This critical thickness decreases when the germanium concentration increases, the latter is given as an illustration, its estimation varying depending on the sources in the literature. The area A corresponds to an area in which the alloy $Si_xGe_y$ is stressed. The area C corresponds to an area in which the alloy $Si_xGe_y$ is relaxed, the area B corresponding to an intermediate area in which the alloy $Si_xGe_y$ is said to be metastable.

Thus, by exploiting the fact that the buried oxide layer 3 prevents the propagation of the dislocations from the prestress layer 2 to the film of silicon 4, a prestress layer 2 can advantageously be used whose thickness is greater than the critical thickness $tc_{SiGe}$.

In practice, according to the reference J. Appl. Phys. 110, 083829 (2011) and by referring to FIG. 3 of that same reference, a prestress layer containing 52% germanium and of thickness equal to 40 nm can be preferred to a prestress layer of the same thickness but containing less than 44% of germanium; the prestress layer containing 52% of germanium conserving 85% of its nominal deformation therefore remains the place of an elastic energy that can be transferred to the silicon film 2 greater than that of a layer of concentration less than 44%, and even if the latter does not relax a part of its elastic energy by dislocation emission.

Figure 3C:
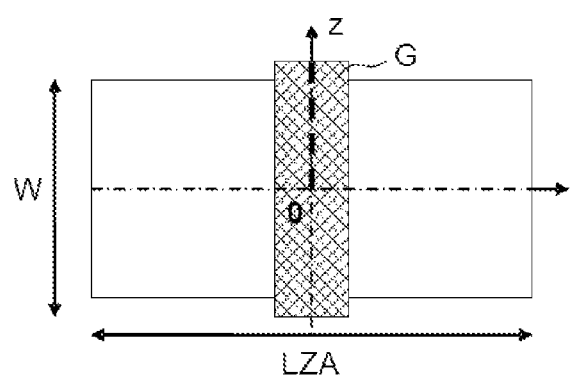

First Exemplary Application of the Method of the Invention to Define an Optimum Bi-axial Stress in a Transistor Channel A structure is produced such as that illustrated in FIG. 3, comprising, on the surface of a silicon substrate, a layer of alloy of $Si_xGe_y$ of thickness $t_{SiGe}$, a buried oxide layer BOX of thickness $t_{Box}$, a layer of silicon of thickness $t_{Si}$, in which an optimized stress is to be created, covered by a top layer of oxide of thickness $t_{ox}$, with a pattern dimension W determined by the functions that are to be used. Generally, the data $t_{BOX}$, $t_{Si}$, and $t_{ox}$, are more or less previously defined and the aim according to the method of the present invention is to optimize, from these fixed input parameters, according to the dimension W, the pair: fraction y/thickness $t_{SiGe}$. The layer of $Si_xGe_y$ can be obtained by conventional epitaxy techniques.

FIG. 9 illustrates more specifically how the method of the present invention makes it possible to optimize the layer creation conditions as a function of a given pattern dimension W. It involves relating the two optimum curves: the curve corresponding more specifically to the straight line illustrated in FIG. 7 and relating to the variation of the thickness of the layer of alloy of $Si_xGe_y$ as a function of the stress pattern dimension and the curve of critical thickness up to which the germanium concentration in the alloy can be pushed. For example, for a dimension W=100 nm, the optimum thickness of SiGe relative to the geometry of the structure is 35 nm (straight line of FIG. 7 carried forward). Then, for this same thickness (as indicated by the upward-pointing arrow), the maximum concentration is determined by the properties of the alloy SiGe (second curve: named optimum 2) in the present case leading to determining a germanium concentration of 0.47.

Thus, according to this example for a predetermined pattern dimension, it is possible according to the method of the invention to determine a pair of values in terms of thickness of layer of alloy and of germanium concentration in the alloy so as to obtain a maximum stress component at the level of the layer in which the pattern is produced, i.e. the layer 4.

According to the present example, in the case of a rectangular active area W=L=100 nm, the biaxial stress at the centre is 1.4 GPa. This size approximates to the active area of the nMOSFETs for the logic circuits.

When the optimum creation conditions are defined, it is conventionally advisable to produce a set of insulating blocks of $SiO_2$ making it possible to separate the active transistor areas. For this, a polishing stop layer of silicon nitride SiN is commonly used.

Nevertheless, as illustrated by FIG. 10 relating to the trend of the stress component as a function of the thickness of SiN during the etching, the presence of layers above the layer of silicon in which the pattern is stressed greatly limits the stress transfer.

The Applicant proposes an optimization in the conventional sequencing of the steps to produce an architecture of STI type in order to avoid the deposition of SiN (of the order of 80 nm) before etching. According to this conventional technique, the silicon substrate is covered with a layer of silicon nitride. This layer and the underlying layers are etched outside the patterns defining the active areas. Then, the trenches in the silicon are filled with silicon oxide.

A method of CMP (chemical mechanical polishing) type can advantageously be used which makes it possible to eliminate any oxide above the nitride surface by retaining only insulating blocks of silicon oxide between the active transistor areas.

Thus, the conventional sequence of the different steps is as follows:
deposition of a polishing stop layer SiN;
etching of the active area;
filling with the oxide (STI);
polishing to the layer of SiN (CMP);
removal of the SiN mask.

According to the present invention it is proposed to first carry out the etching at the periphery of a surface of dimensions greater than the dimensions of the stress pattern.

One example of a transistor fabrication method is to this end illustrated by FIGS. 11a to 11f.

The following layers are stacked on a silicon substrate 1:
a layer 2 of alloy of $Si_xGe_y$;
a buried oxide layer 3;
a layer 4 of silicon corresponding to the layer inside which a stress is to be optimized;
a top layer of oxide 5.

Figure 11A:
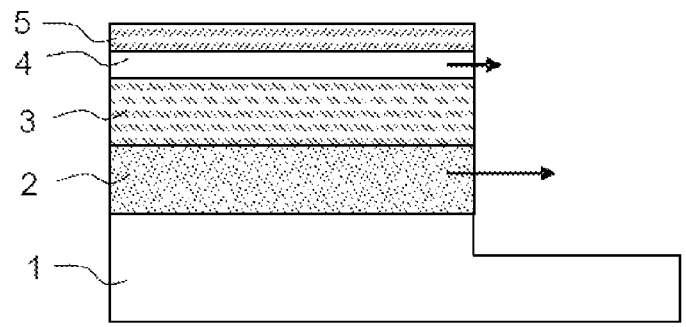

An etching operation is then carried out as illustrated in FIG. 11a which makes it possible to optimize the value of the stress according to the teaching illustrated by the curves of FIG. 4.

Figure 11B:
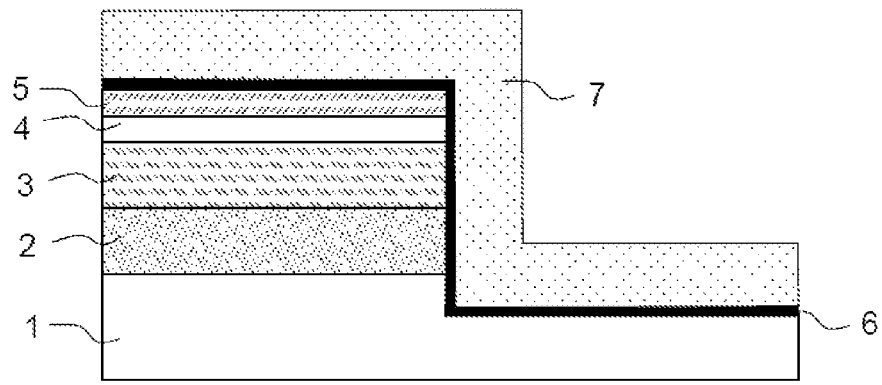

An insulating layer 6 is then produced, followed by the deposition of a layer 7 of silicon nitride, as illustrated in FIG. 11b.

Figure 11C:
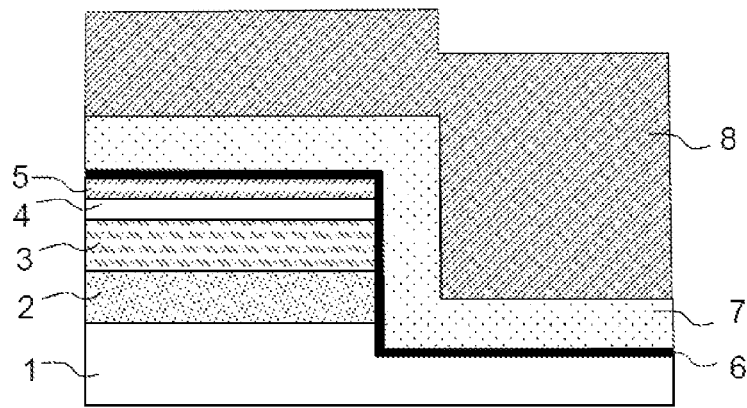

A thick deposition of silicon oxide 8 is then produced, as illustrated in FIG. 11c, corresponding to the oxide of the blocks STI.

Figure 11D:
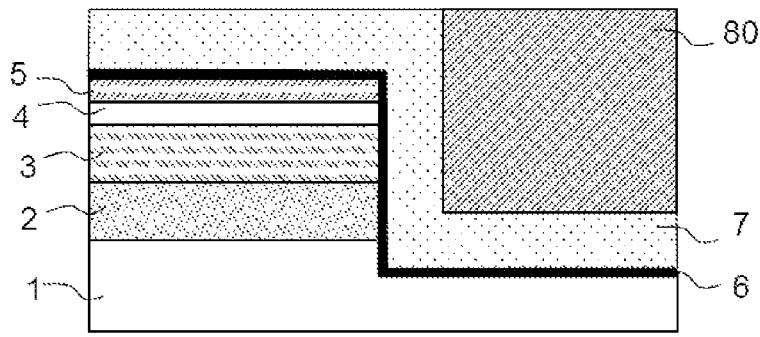

A conventional polishing operation, of CMP type for example, is then carried out until the layer of silicon nitride is revealed as illustrated in FIG. 11d.

Figure 11E:
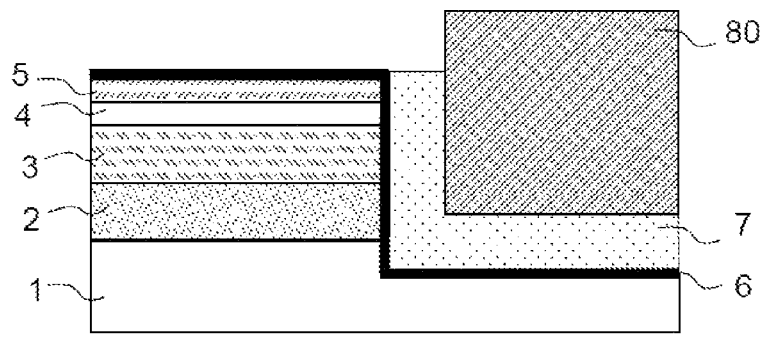

The next step is to remove the silicon nitride and the layer of insulator above the active layer of silicon in which the stress is transferred and corresponding to a so-called gate area, as illustrated in FIG. 11e.

Figure 11F:
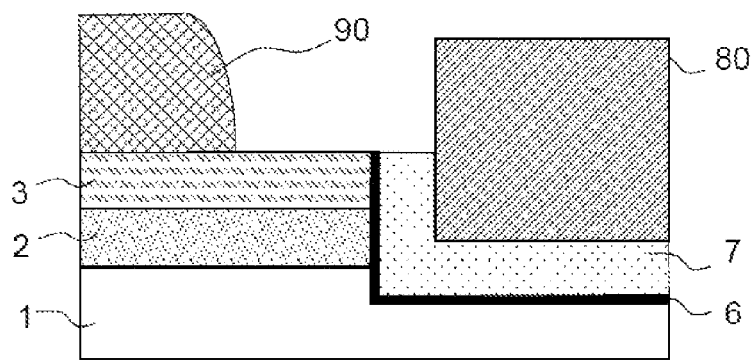

The gate 90 is positioned facing said gate area, as illustrated in FIG. 11f.

Second Example of Application of the Method of the Invention to Define an Optimum Biaxial Stress in a Transistor Channel:

According to this second example, it is also possible to produce the stack illustrated in FIG. 12 comprising: the Si substrate of thickness $t_{bluk}$/a first buried oxide of thickness $t_{oxide}$/the prestressed layer of alloy $Si_xGe_y$ of thickness $t_{SiGe}$/the second buried oxide Box of thickness $t_{Box}$/the silicon film of thickness $t_{Si}$/a layer of oxide of thickness $t_{ox}$.

This type of stack can be produced by known condensation techniques as described in particular in the article by B. Vincent et al.; "*Fabrication of SiGe-on-insulator substrates by a condensation technique: an experimental and modelling study*"; Semicond. Sci. Technol., 22, (2007), 237-244.

The invention claimed is:

1. A method for stressing a pattern having a pattern surface with pattern dimensions, in a layer of semiconductive material on the surface of a stack of layers generated on the surface of a substrate, said stack comprising at least one stress layer of alloy $Si_xGe_y$, with x and y being molar fractions, and a buried layer of silicon oxide, the buried layer of silicon oxide being situated between said layer of semiconductive material and said stress layer of alloy $Si_xGe_y$, the method comprising:

determining a first function $t_{SiGe}=f(W)$, wherein $t_{SiGe}$ is an optimum thickness of the layer of alloy $Si_xGe_y$ as a function of a pattern dimension (W), thereby obtaining a maximum stress ($S0_{ZZ}$) in said pattern, said optimum thickness being independent of the molar fraction y;

determining a second function $tc_{SiGe}=g(y)$ wherein $tc_{SiGe}$ is a critical thickness of the layer of alloy $Si_xGe_y$ beyond which dislocations appear in said stress layer for a given molar fraction y;

determining the molar fraction y by equality of the thicknesses $t_{SiGe}=tc_{SiGe}$, thereby defining, for a given pattern dimension (W), an optimum pair of values ($t_{SiGe}$, y);

fabricating the stack including the stress layer of alloy $Si_xGe_y$ using the optimum pair of values ($t_{SiGe}$, y); and etching at the periphery of a surface of dimensions greater than or equal to those of said pattern surface dimensions, of the buried layer of silicon oxide and of the stress layer of alloy $Si_xGe_y$ over at least a part of the depth of said layer of alloy.

2. The method for stressing a pattern in a layer of semiconductive material according to claim 1, in which the alloy $Si_xGe_y$ is doped.

3. The method for stressing a pattern in a layer of semiconductive material according to claim 1, in which the thickness of the layer of alloy $Si_xGe_y$ is substantially equal to the critical thickness beyond which dislocations are likely to appear in said layer of alloy $Si_xGe_y$.

4. The method for stressing a pattern in a layer of semiconductive material according to claim 1, in which the etching is performed also in a part of said substrate over a non-zero etching depth.

5. A transistor fabrication method, comprising the method for stressing a pattern according to claim 1, and further comprising etching of an active area of which a dimension (LZA) in the direction of the current in the plane of the layers is at least greater than or equal to the sum of the dimensions of a source area, of a gate area and of a drain area.

6. The transistor fabrication method according to claim 5, further comprising:
a step of deposition of a layer of silicon nitride, after the step of etching of the active area;
a step of thick oxide layer deposition;
production of oxide insulation blocks on either side of the source, gate and drain areas.

7. The method for stressing a pattern in a layer of semiconductive material according to claim 1, in which the molar fraction y is equal to 1−x.

8. The method for stressing a pattern in a layer of semiconductive material according to claim 7, in which the alloy $Si_xGe_y$ is doped.

9. The method for stressing a pattern in a layer of semiconductive material according to claim 7, in which the thickness of the layer of alloy $Si_xGe_y$ is substantially equal to the critical thickness beyond which dislocations are likely to appear in said layer of alloy $Si_xGe_y$.

10. The method for stressing a pattern in a layer of semiconductive material according to claim 7, in which the etching is performed also in a part of said substrate over a non-zero etching depth.

11. A transistor fabrication method, comprising the method for stressing a pattern according to claim 7, and further comprising etching of an active area of which a dimension (LZA) in the direction of the current in the plane of the layers is at least greater than or equal to the sum of the dimensions of a source area, of a gate area and of a drain area.

12. The transistor fabrication method according to claim 11, comprising:
a step of deposition of a layer of silicon nitride, after the step of etching of the active area;
a step of thick oxide layer deposition;
production of oxide insulation blocks on either side of the source, gate and drain areas.

13. The method for stressing a pattern in a layer of semiconductive material according to claim 1, in which the semiconductive material is silicon.

* * * * *